(12) United States Patent
Lin et al.

(10) Patent No.: US 10,014,035 B2
(45) Date of Patent: Jul. 3, 2018

(54) CONTROL DEVICE FOR CONTROLLING SEMICONDUCTOR MEMORY DEVICE

(71) Applicant: M31 TECHNOLOGY CORPORATION, Zhubei, Hsinchu County (TW)

(72) Inventors: Yu-Fen Lin, Zhubei (TW); Nan-Chun Lien, Zhubei (TW)

(73) Assignee: M31 TECHNOLOGY CORPORATION, Zhubei (TW)

( * ) Notice: Subject to any disclaimer, the term of this patent is extended or adjusted under 35 U.S.C. 154(b) by 0 days.

(21) Appl. No.: 15/674,248

(22) Filed: Aug. 10, 2017

(65) Prior Publication Data
US 2018/0047431 A1 Feb. 15, 2018

(30) Foreign Application Priority Data
Aug. 15, 2016 (TW) .............................. 105125932 A

(51) Int. Cl.
*G11C 7/08* (2006.01)
*G11C 7/22* (2006.01)
*G11C 7/12* (2006.01)
*G11C 7/14* (2006.01)
*G11C 11/419* (2006.01)

(52) U.S. Cl.
CPC .................. *G11C 7/08* (2013.01); *G11C 7/12* (2013.01); *G11C 7/14* (2013.01); *G11C 7/227* (2013.01); *G11C 11/419* (2013.01)

(58) Field of Classification Search
CPC .... G11C 7/08; G11C 7/06; G11C 7/12; G11C 7/14; G11C 7/22; G11C 7/227; G11C 11/419
USPC ............................. 365/63, 207, 210.1, 233.1
See application file for complete search history.

(56) References Cited

U.S. PATENT DOCUMENTS

| | | | | |
|---|---|---|---|---|
| 6,442,081 B1 * | 8/2002 | Nagashima | ............ | G11C 5/147 365/189.08 |
| 2012/0257464 A1 * | 10/2012 | Moriwaki | ............ | G11C 11/419 365/189.11 |

* cited by examiner

*Primary Examiner* — Tan T. Nguyen
(74) *Attorney, Agent, or Firm* — Hamre, Schumann, Mueller & Larson, P.C.

(57) ABSTRACT

A control device includes: a dummy memory cell group; a transistor having a first terminal, a grounded second terminal and a control terminal; an adjustor providing a resistance between the dummy memory cell group and the first terminal of the transistor; an inverter generating, based on a voltage at the first terminal of the transistor, a sense start signal that is associated with switching of a sense amplifier circuit of a semiconductor memory device from a disabled state to an enabled state; and a controller generating, based on the sense start signal, a control signal for controlling the transistor such that switching of the transistor from conduction into non-conduction is associated with the sense start signal.

20 Claims, 8 Drawing Sheets

CONTROL DEVICE FOR CONTROLLING SEMICONDUCTOR MEMORY DEVICE

CROSS-REFERENCE TO RELATED APPLICATION

This application claims priority of Taiwanese Patent Application No. 105125932, filed on Aug. 15, 2016.

FIELD

The disclosure relates to a control device, and more particularly to a control device for controlling a semiconductor memory device.

BACKGROUND

FIG. 1 illustrates a conventional control device 11 for controlling a semiconductor memory device 12. The semiconductor memory device 12 includes a memory cell array 122 and a sense amplifier circuit 121. The memory cell array 122 includes a plurality of bit lines ($BL_1$-$BL_m$, $BLB_1$-$BLB_m$) for transmitting data outputted by the memory cell array 122. The sense amplifier circuit 121 is coupled to the bit lines ($BL_1$-$BL_m$, $BLB_1$-$BLB_m$), and is operable between an enabled state and a disabled state. When operating in the enabled state, the sense amplifier circuit 121 senses the data outputted by the memory cell array 122 to generate a sensed output (vd). When operating in the disabled state, the sense amplifier circuit 121 does not perform sensing.

The conventional control device 11 includes a dummy memory cell group 111, an nMOSFET (N-type metal oxide semiconductor field effect transistor) 112, a pMOSFET (P-type metal oxide semiconductor field effect transistor) 116, an inverter 114, a signal generator 115 and a controller 113. The nMOSFET 112 has a first terminal that is coupled to the dummy memory cell group 111, a second terminal that is grounded, and a control terminal. The nMOSFET 112 cooperates with the dummy memory cell group 111 to form a tracking cell that emulates behavior of the memory cell array 122 when being read. The pMOSFET 116 has a first terminal that receives a pre-charge voltage (vp), a second terminal that is coupled to the first terminal of the nMOSFET 112, and a control terminal. The inverter 114 is coupled to the first terminal of the nMOSFET 112, has a switching threshold that is lower than the pre-charge voltage (vp), and generates a sense start signal based on a voltage (vb) at the first terminal of the nMOSFET 112. The signal generator 115 is coupled to the inverter 114 for receiving the sense start signal therefrom, is coupled further to the sense amplifier circuit 121 of the semiconductor memory device 12, and generates, based on the sense start signal and a predetermined time interval, a sense enable signal (vc) for controlling operation of the sense amplifier circuit 121 between the enabled state and the disabled state. The controller 113 is coupled to the inverter 114 for receiving the sense start signal therefrom, is coupled further to the control terminals of the MOSFETs 112, 116, and generates, based on the sense start signal, two control signals ($T_{WL}$, $T_{WL}'$) for respectively controlling the MOSFETs 112, 116.

Assuming that other than fabrication variations, all conditions the conventional control device 11 and the semiconductor memory device 12 are subjected to are controlled to be identical, FIG. 2 depicts voltages ($VBL_1$, $VBLB_1$) respectively at the bit lines ($BL_1$, $BLB_1$), the control signal ($T_{WL}$) and the sense enable signal (vc) under a circumstance where the fabrication process varies to an nMOSFET-slow pMOSFET-slow (NSPS) corner, and FIG. 3 depicts the voltages ($VBL_1$, $VBLB_1$), the control signal ($T_{WL}$) and the sense enable signal (vc) under a circumstance where the fabrication process varies to an nMOSFET-slow pMOSFET-fast (NSPF) corner.

Referring to FIGS. 1 to 3, initially, the memory cell array 122 is not read, and the control signals ($T_{WL}$, $T_{WL}'$) are both at a logic low level. Therefore, the voltages ($VBL_1$, $VBLB_1$) are both at a predetermined voltage value, then MOSFET 112 does not conduct, the pMOSFET 116 conducts, the voltage (vb) equals the pre-charge voltage (vp), the sense start signal and the sense enable signal (vc) are both at the logic low level, and the sense amplifier circuit 121 operates in the disabled state.

Thereafter, the memory cell array 122 is read, and the control signals ($T_{WL}$, $T_{WL}'$) both switch to a logic high level. As a consequence, one of the voltages ($VBL_1$, $VBLB_1$) (e.g., the voltage ($VBLB_1$)) remains at the predetermined voltage value, the other of the voltages ($VBL_1$, $VBLB_1$) (e.g., the voltage ($VBL_1$)) decreases gradually, the nMOSFET 112 switches into conduction, the pMOSFET 116 switches into non-conduction, and the voltage (vb) decreases gradually. When the voltage (vb) decreases below the switching threshold of the inverter 114, the sense start signal and the sense enable signal (vc) both switch to the logic high level, the sense amplifier circuit 121 enters the enabled state, and the control signals ($T_{WL}$, $T_{WL}'$) both switch to the logic low level. Therefore, the nMOSFET 112 switches into non-conduction, the pMOSFET 116 switches into conduction, and the voltage (vb) increases gradually. The sense start signal switches to the logic low level when the voltage (vb) increases above the switching threshold of the inverter 114. The sense enable signal (vc) remains at the logic high level and the sense amplifier circuit 121 remains in the enabled state for the predetermined time interval before the sense enable signal (vc) switches to the logic low level, making the sense amplifier circuit 121 enter the disabled state.

In the aforesaid case, the switching threshold of the inverter 114 in the circumstance where the fabrication process varies to the NSPF corner is higher than that in the circumstance where the fabrication process varies to the NSPS corner. Therefore, a time point (t1) (at which the sense enable signal (vc) switches to the logic high level in the circumstance where the fabrication process varies to the NSPF corner as shown in FIG. 3) is earlier than a time point (t2) (at which the sense enable signal (vc) switches to the logic high level in the circumstance where the fabrication process varies to the NSPS corner as shown in FIG. 2) with respect to a time point (t0) (at which the control signal ($T_{WL}$) switches to the logic high level as shown in FIGS. 2 and 3), and a difference (V2) between the voltages ($VBL_1$, $VBLB_1$) at the time point (t1) as shown in FIG. 3 is less than that (V1) at the time point (t2) as shown in FIG. 2.

In a first case where the conventional control device 11 is designed such that the difference (V1) at the time point (t2) equals a minimum voltage difference which the sense amplifier circuit 121 can sense correctly, the semiconductor memory device 12 can have a relatively high operation speed. However, although the sense amplifier circuit 121 can correctly sense the difference (V1) at the time point (t2) in the circumstance where the fabrication process varies to the NSPS corner, it cannot correctly sense the difference (V2) at the time point (t1) in the circumstance where the fabrication process varies to the NSPF corner.

In a second case where the conventional control device 11 is designed such that the difference (V2) at the time point (t1) equals the minimum voltage difference (i.e., the time point (t1) in the second case is concurrent with the time point (t2) in the first case with respect to the time point (t0)), the sense amplifier circuit 121 can not only correctly sense the difference (V1) at the time point (t2) in the circumstance where the fabrication process varies to the NSPS corner, but also correctly sense the difference (V2) at the time point (t1) in the circumstance where the fabrication process varies to the NSPF corner. However, the operation speed of the semiconductor memory device 12 is relatively low in the second case since the time point (t2) in the second case is later than that in the first case with respect to the time point (t0).

SUMMARY

Therefore, an object of the disclosure is to provide a control device which can result in that a semiconductor memory device can have a relatively high operation speed, and that, regardless of variation of fabrication process of the control device and the semiconductor memory device to an NSPS corner or an NSPF corner, a sense amplifier circuit of the semiconductor memory device can correctly sense data.

According to an aspect of the disclosure, the control device is used with a semiconductor memory device that includes a plurality of memory cell groups and a sense amplifier circuit. The sense amplifier circuit is coupled to the memory cell groups, and is operable between an enabled state and a disabled state. When operating in the enabled state, the sense amplifier circuit senses data respectively outputted by the memory cell groups. The control device includes a dummy memory cell group, a transistor, an adjustor, an inverter and a controller. The transistor has a first terminal, a second terminal that is grounded, and a control terminal. The adjustor is coupled to the dummy memory cell group and the first terminal of the transistor, and provides a resistance between the dummy memory cell group and the first terminal of the transistor. The inverter is coupled to the first terminal of the transistor, and generates, based on a voltage at the first terminal of the transistor, a sense start signal that is associated with switching of the sense amplifier circuit from the disabled state to the enabled state. The controller is coupled to the inverter for receiving the sense start signal therefrom, is coupled further to the control terminal of the transistor, and generates, based on the sense start signal, a control signal for controlling the transistor such that switching of the transistor from conduction into non-conduction is associated with the sense start signal.

According to another aspect of the disclosure, the control device is used with a semiconductor memory device that includes a plurality of memory cell groups and a sense amplifier circuit. The sense amplifier circuit is coupled to the memory cell groups, and is operable between an enabled state and a disabled state. When operating in the enabled state, the sense amplifier circuit senses data respectively outputted by the memory cell groups. The control device includes a dummy memory cell group, a transistor, an adjustor, an inverter and a controller. The transistor has a first terminal that is coupled to the dummy memory cell group, a second terminal that is grounded, and a control terminal. The adjustor is coupled to the first terminal of the transistor, and is operable to provide charges to or draw charges from the first terminal of the transistor. The inverter is coupled to the first terminal of the transistor, and generates, based on a voltage at the first terminal of the transistor, a sense start signal that is associated with switching of the sense amplifier circuit from the disabled state to the enabled state. The controller is coupled to the inverter for receiving the sense start signal therefrom, is coupled further to the control terminal of the transistor, and generates, based on the sense start signal, a control signal for controlling the transistor such that switching of the transistor from conduction into non-conduction is associated with the sense start signal.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
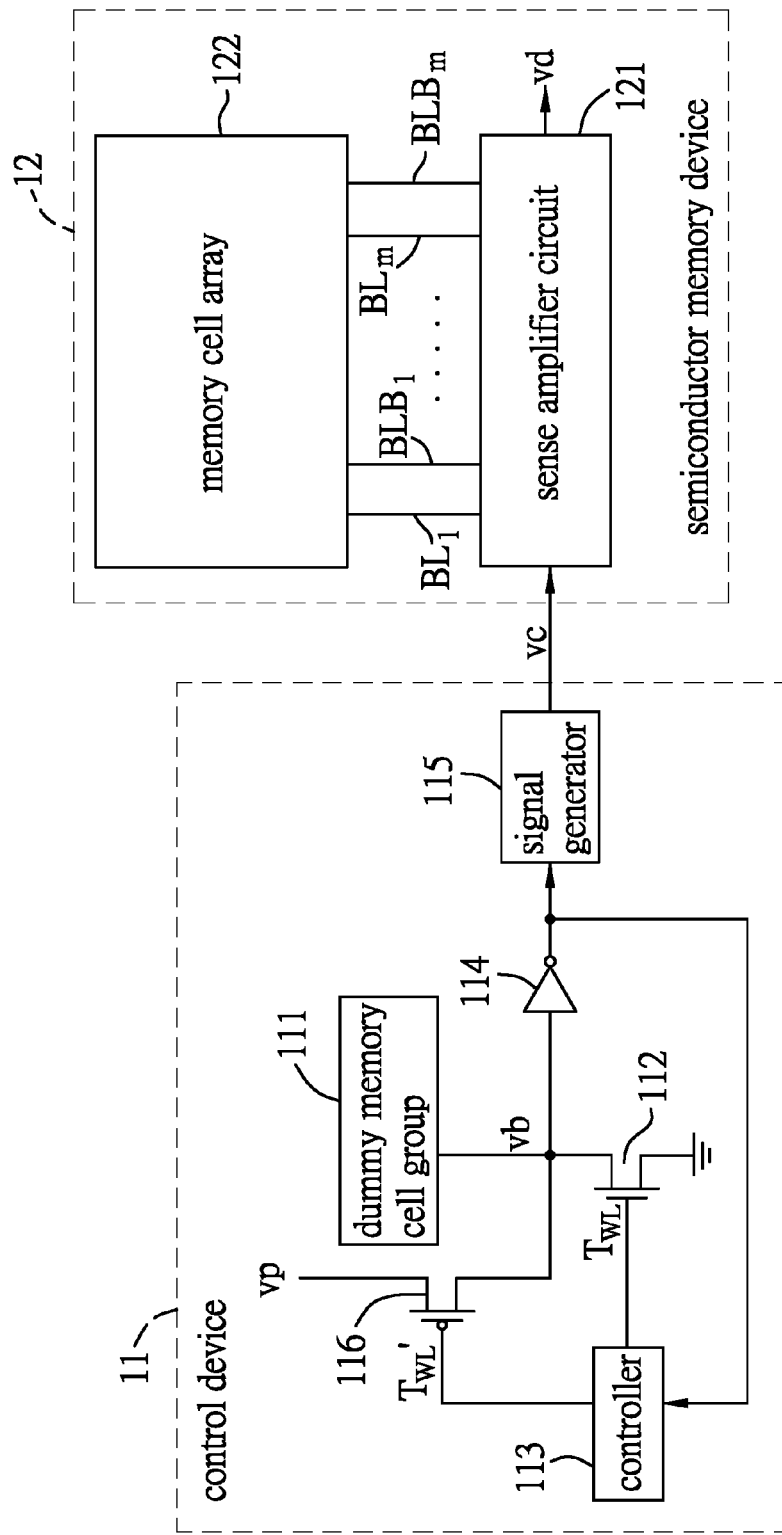
FIG. 1 is a circuit block diagram illustrating a conventional control device in use with a semiconductor memory device.
Figure 2:
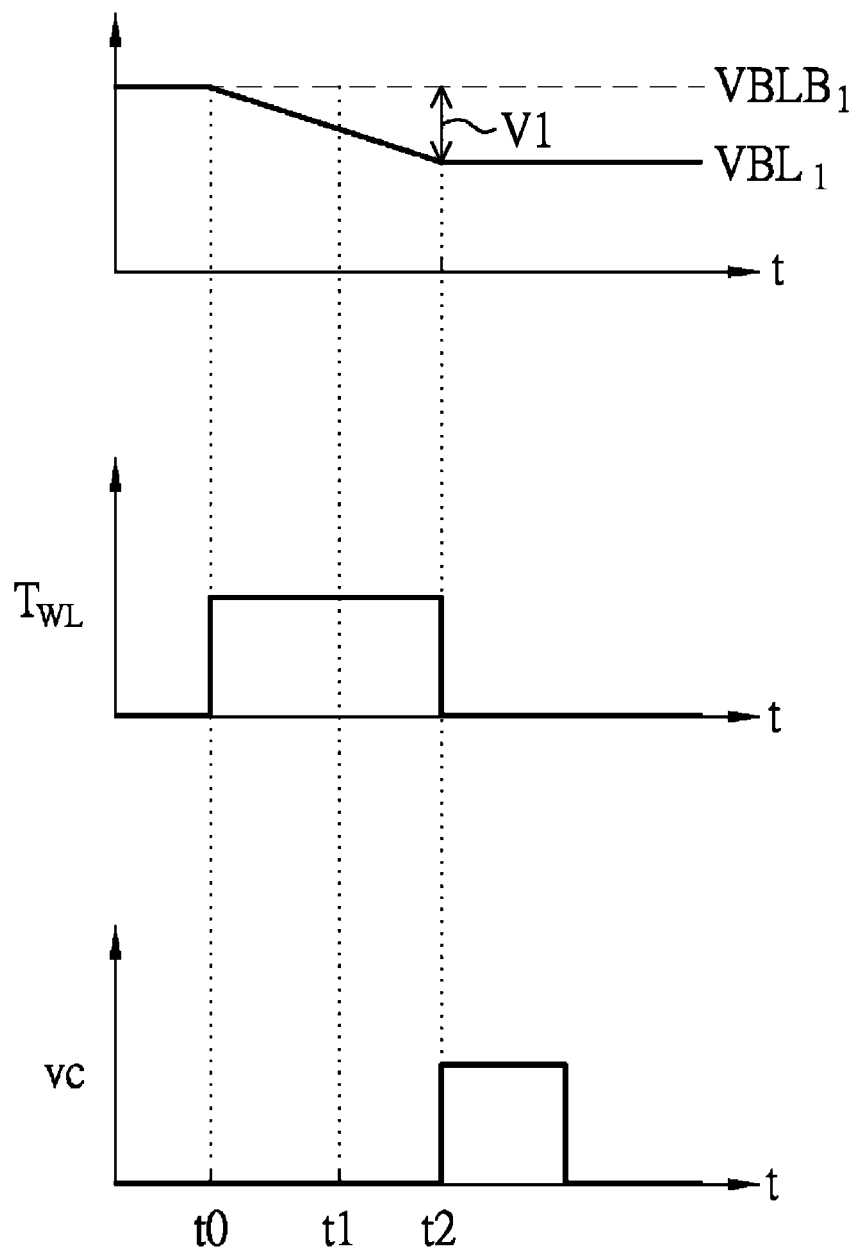
FIG. 2 is a timing diagram illustrating operation of the conventional control device and the semiconductor memory device in a circumstance where fabrication process of the conventional control device and the semiconductor memory device varies to an NSPS corner.
Figure 3:
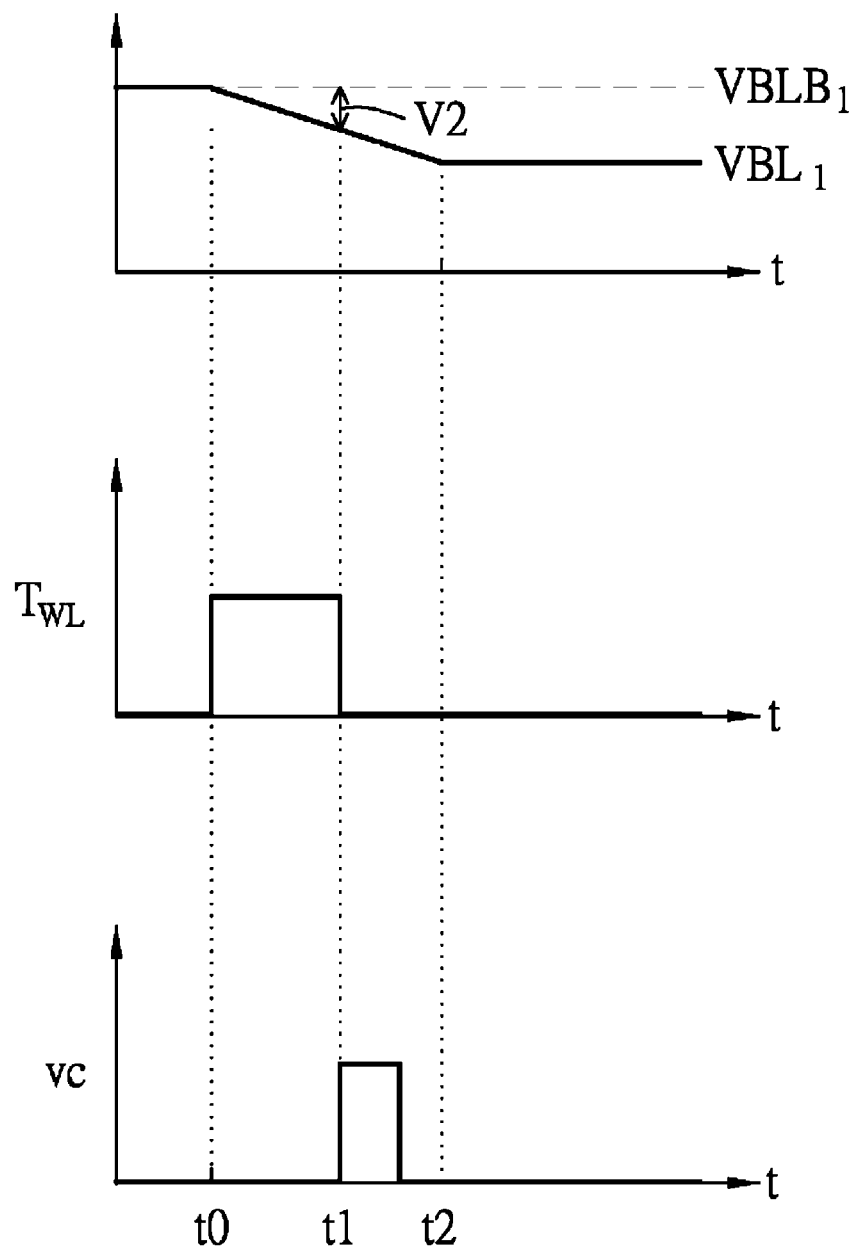
FIG. 3 is a timing diagram illustrating operation of the conventional control device and the semiconductor memory device in a circumstance where the fabrication process varies to an NSPF corner.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 4:
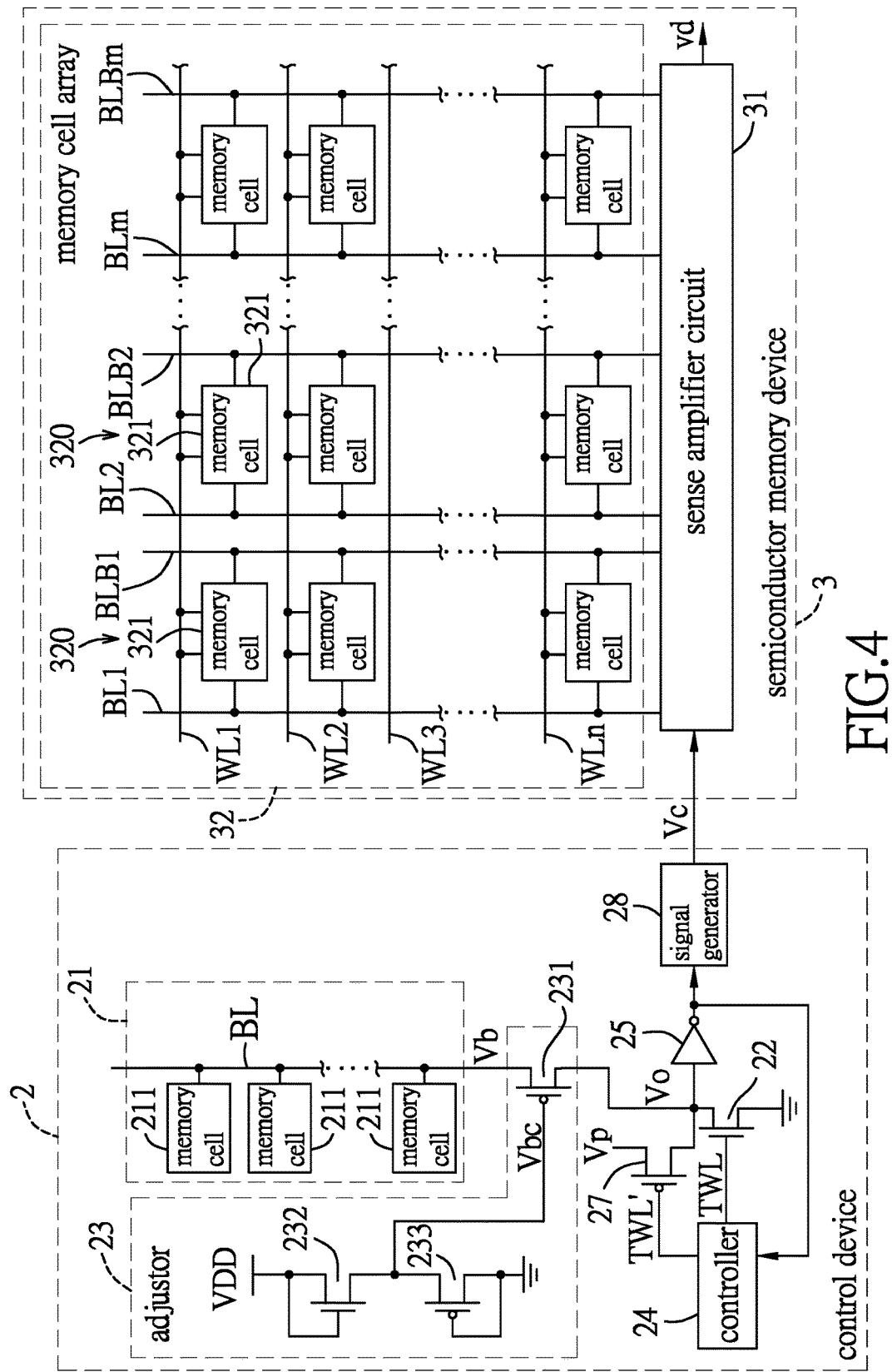
FIG. 4 is a circuit block diagram illustrating a first embodiment of a control device according to the disclosure in use with a semiconductor memory device.

Referring to FIG. 4, a first embodiment of a control device 2 according to the disclosure is used with a semiconductor memory device 3 that includes a memory cell array 32 and a sense amplifier circuit 31. The memory cell array 32 includes a plurality of memory cells 321, a plurality of word lines (WL1-WLn), a first group of bit lines (BL1-BLm) and a second group of bit lines (BLB1-BLBm). Each memory cell 321 is, for example, a 6T (six-transistor) SRAM (static random access memory) cell. The memory cells 321 are arranged in a matrix with a plurality of rows and a plurality of columns. Each word line (WL1-WLn) is coupled to the memory cells 321 in a respective row (i.e., a respective memory cell row). Each bit line (BL1-BLm) of the first group is coupled to the memory cells 321 in a respective column (i.e., a respective memory cell column). Each bit line (BLB1-BLBm) of the second group is coupled to the memory cells 321 in a respective column (i.e., a respective memory cell column). The memory cells 321 in each column (i.e., each memory cell column) cooperate with the corresponding bit lines (BL1-BLm, BLB1-BLBm) in the first and second groups to form a respective memory cell group 320.

The word lines (WL1-WLn) transmit a control input to the memory cells 321 in order to control the memory cells 321 to output data stored therein to the bit lines (BL1-BLm, BLB1-BLBm). The sense amplifier circuit 31 is coupled to the bit lines (BL1-BLm, BLB1-BLBm), and is operable between an enabled state and a disabled state. When operating in the enabled state, the sense amplifier circuit 31 senses the data outputted by the memory cells 321 to generate a sensed output (vd). When operating in the disabled state, the sense amplifier circuit 31 does not perform sensing.

The control device 2 of this embodiment includes a dummy memory cell group 21, two transistors 22, 27, an adjustor 23, an inverter 25, a signal generator 28 and a controller 24.

The dummy memory cell group 21 includes a plurality of memory cells 211 that are arranged in a column (i.e., cooperatively forming a memory cell column), and a bit line (BL) that is coupled to the memory cells 211. Each memory cell 211 is, for example, a 6T SRAM cell.

It should be noted that, alternatively, each word line (WL1-WLn) may be coupled to the memory cells 321 in a respective column (i.e., a respective memory cell column); each bit line (BL1-BLm) of the first group may be coupled to the memory cells 321 in a respective row (i.e., a respective memory cell row); each bit line (BLB1-BLBm) of the second group may be coupled to the memory cells 321 in a respective row (i.e., a respective memory cell row); the memory cells 321 in each row (i.e., each memory cell row) may cooperate with the corresponding bit lines (BL1-BLm, BLB1-BLBm) in the first and second groups to form a respective memory cell group 320; and the memory cells 211 may be arranged in a row (i.e., cooperatively forming a memory cell row).

The transistor 22 (e.g., an nMOSFET (N-type metal oxide semiconductor field effect transistor)) has a first terminal, a second terminal that is grounded, and a control terminal. The transistor 22 cooperates with the dummy memory cell group 21 to form a tracking cell that emulates behavior of the memory cell array 32 when being read.

The transistor 27 (e.g., a pMOSFET (P-type metal oxide semiconductor field effect transistor)) has a first terminal that is used to receive a pre-charge voltage (Vp), a second terminal that is coupled to the first terminal of the transistor 22, and a control terminal.

The adjustor 23 is coupled to the bit line (BL) and the first terminal of the transistor 22, and provides a resistance between the bit line (BL) and the first terminal of the transistor 22. In this embodiment, the adjustor 23 includes three transistors 231-233. The transistor 231 (e.g., a pMOSFET) is coupled between the bit line (BL) and the first terminal of the transistor 22, and has a control terminal. The transistor 232 (e.g., an nMOSFET) has a first terminal that is used to receive a supply voltage (VDD), a second terminal that is coupled to the control terminal of the transistor 231, and a control terminal that is coupled to the first terminal thereof. The transistor 233 (e.g., a pMOSFET) has a first terminal that is coupled to the control terminal of the transistor 231, a second terminal that is grounded, and a control terminal that is coupled to the second terminal thereof. The transistors 232, 233 cooperatively provide a bias voltage (Vbc) for the transistor 231, and the transistor 231 provides the resistance based on the bias voltage (Vbc).

The inverter 25 is coupled to the first terminal of the transistor 22, has a switching threshold that is lower than the pre-charge voltage (Vp), and generates a sense start signal based on a voltage (Vo) at the first terminal of the transistor 22.

The signal generator 28 is coupled to the inverter 25 for receiving the sense start signal therefrom, is used to be coupled further to the sense amplifier circuit 31 of the semiconductor memory device 3, and generates, based on the sense start signal and a predetermined time interval, a sense enable signal (Vc) for controlling operation of the sense amplifier circuit 31 between the enabled state and the disabled state. The sense enable signal (Vc) is switchable between an active state (e.g., being at a logic high level, and corresponding to the enabled state of the sense amplifier circuit 31) and an inactive state (e.g., being at a logic low level, and corresponding to the disabled state of the sense amplifier circuit 31). The sense enable signal (Vc) switches to the logic high level upon switching of the sense start signal to the logic high level, and remains at the logic high level for the predetermined time interval before switching to the logic low level.

The controller 24 is coupled to the inverter 25 for receiving the sense start signal therefrom, is coupled further to the control terminals of the transistors 22, 27, and generates, based on the sense start signal, two control signals (TWL, TWL') for respectively controlling the transistors 22, 27. Each control signal (TWL, TWL') is switchable between the logic high level and the logic low level. The control signal (TWL) switches to the logic high level (i.e., corresponding to conduction of the transistor 22) when the memory cell array 32 is read, and switches to the logic low level (i.e., corresponding to non-conduction of the transistor 22) upon the switching of the sense start signal to the logic high level. The control signal (TWL') switches to the logic high level (i.e., corresponding to non-conduction of the transistor 27) when the memory cell array 32 is read, and switches to the logic low level (i.e., corresponding to conduction of the transistor 27) upon the switching of the sense start signal to the logic high level.

It should be noted that, due to a finite operation speed of the controller 24, switching of the control signal (TWL) to the logic low level lags the switching of the sense start signal to the logic high level by a time interval (T0) (see FIG. 5), and switching of the control signal (TWL') to the logic high level also lags the switching of the sense start signal to the logic high level. In this embodiment, dimensions of the transistors 22, 27 may be such that, even if the switching of the control signal (TWL) to the logic low level comes after the switching of the control signal (TWL') to the logic low level, the voltage (Vo) increases gradually during a time interval between these switchings.

Figure 5:
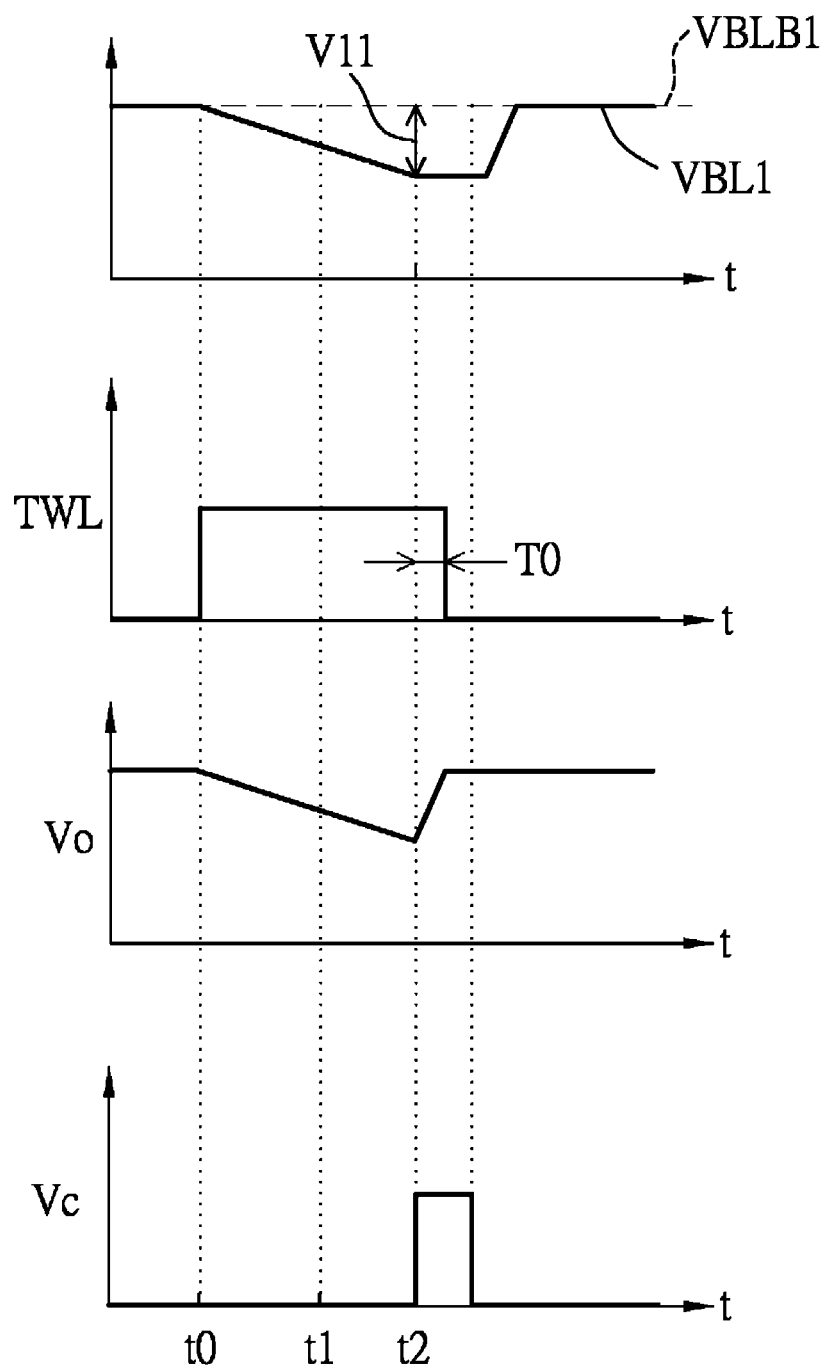
FIG. 5 is a timing diagram illustrating operation of the first embodiment and the semiconductor memory device.

FIG. 5 depicts voltages (VBL1, VBLB1) respectively at the bit lines (BL1, BLB1), the control signal (TWL), the voltage (Vo) and the sense enable signal (Vc). For simplifying the description of the operations of the control device 2 of this embodiment and the semiconductor memory device 3 below, it is assumed that the switching of the control signal (TWL) to the logic low level and the switching of the control signal (TWL') to the logic high level are substantially concurrent with the switching of the sense start signal to the logic high level (i.e., the time interval (T0) and a time interval between the switching of the sense start signal to the logic high level and the switching of the control signal (TWL') to the logic high level are very short, and can be neglected).

Referring to FIGS. 4 and 5, initially, the memory cell array 32 is not read, and the control signals (TWL, TWL') are both at the logic low level. Therefore, the voltages (VBL1, VBLB1) are both at a predetermined voltage value, the transistor 22 does not conduct, the transistor 27 conducts, the voltage (Vo) equals the pre-charge voltage (Vp), a voltage (Vb) at the bit line (BL) increases gradually and is lower than the pre-charge voltage (Vp), the sense start signal and the sense enable signal (Vc) are both at the logic low level, and the sense amplifier circuit 31 operates in the disabled state.

Thereafter, the memory cell array 32 is read, and the control signals (TWL, TWL') both switch to the logic high level. As a consequence, one of the voltages (VBL1, VBLB1) (e.g., the voltage (VBLB1)) remains at the predetermined voltage value, the other of the voltages (VBL1, VBLB1) (e.g., the voltage (VBL1)) decreases gradually, the transistor 22 switches into conduction, the transistor 27 switches into non-conduction, and the voltages (Vb, Vo) both decrease gradually. When the voltage (Vo) decreases below the switching threshold of the inverter 25, the sense start signal and the sense enable signal (Vc) both switch to the logic high level, the sense amplifier circuit 31 enters the enabled state, and the control signals (TWL, TWL') both switch to the logic low level. Therefore, the transistor 22 switches into non-conduction, the transistor 27 switches into conduction, and the voltages (Vb, Vo) both increase gradually. The sense start signal switches to the logic low level when the voltage (Vo) increases above the switching threshold of the inverter 25. The sense enable signal (Vc) remains at the logic high level and the sense amplifier circuit 31 remains in the enabled state for the predetermined time interval before the sense enable signal (Vc) switches to the logic low level, making the sense amplifier circuit 31 enter the disabled state.

The switching threshold of the inverter 25 in a circumstance where fabrication process of the control device 2 of this embodiment and the semiconductor memory device 3 varies to an nMOSFET-slow pMOSFET-fast (NSPF) corner is higher than that in a circumstance where the fabrication process varies to an nMOSFET-slow pMOSFET-slow (NSPS) corner. In addition, the bias voltage (Vbc) in the circumstance where the fabrication process varies to the NSPF corner is lower than that in the circumstance where the fabrication process varies to the NSPS corner, and as a result, in the circumstance where the fabrication process varies to the NSPF corner, the resistance provided by the transistor 231 is relatively less, a current flowing through the transistor 231 from the second terminal thereof to the first terminal thereof during a time interval (where the control signals (TWL, TWL') are both at the logic low level, the time interval having a constant duration despite any fabrication variations) is greater, an amount of energy stored in the dummy memory cell group 21 at a time point (t0) (at which the control signals (TWL, TWL') both switch to the logic high level) is greater, and decrease of the voltage (Vo) during another time interval (where the control signals (TWL, TWL') are both at the logic high level) is slower, as respectively compared to those in the circumstance where the fabrication process varies to the NSPS corner. Consequently, the control device 2 of this embodiment can be designed such that, regardless of variation of the fabrication process to the NSPS corner or the NSPF corner, the sense enable signal (Vc) switches to the logic high level at the same time point (t2), at which a difference (V11) between the voltages (VBL1, VBLB1) equals a minimum voltage difference that the sense amplifier circuit 31 can sense correctly. As a result, the semiconductor memory device 3 can have a relatively high operation speed, and the sense amplifier circuit 31 can correctly sense the difference (V11) at the time point (t2) in both the circumstances where the fabrication process varies respectively to the NSPS corner and the NSPF corner.

Figure 6:
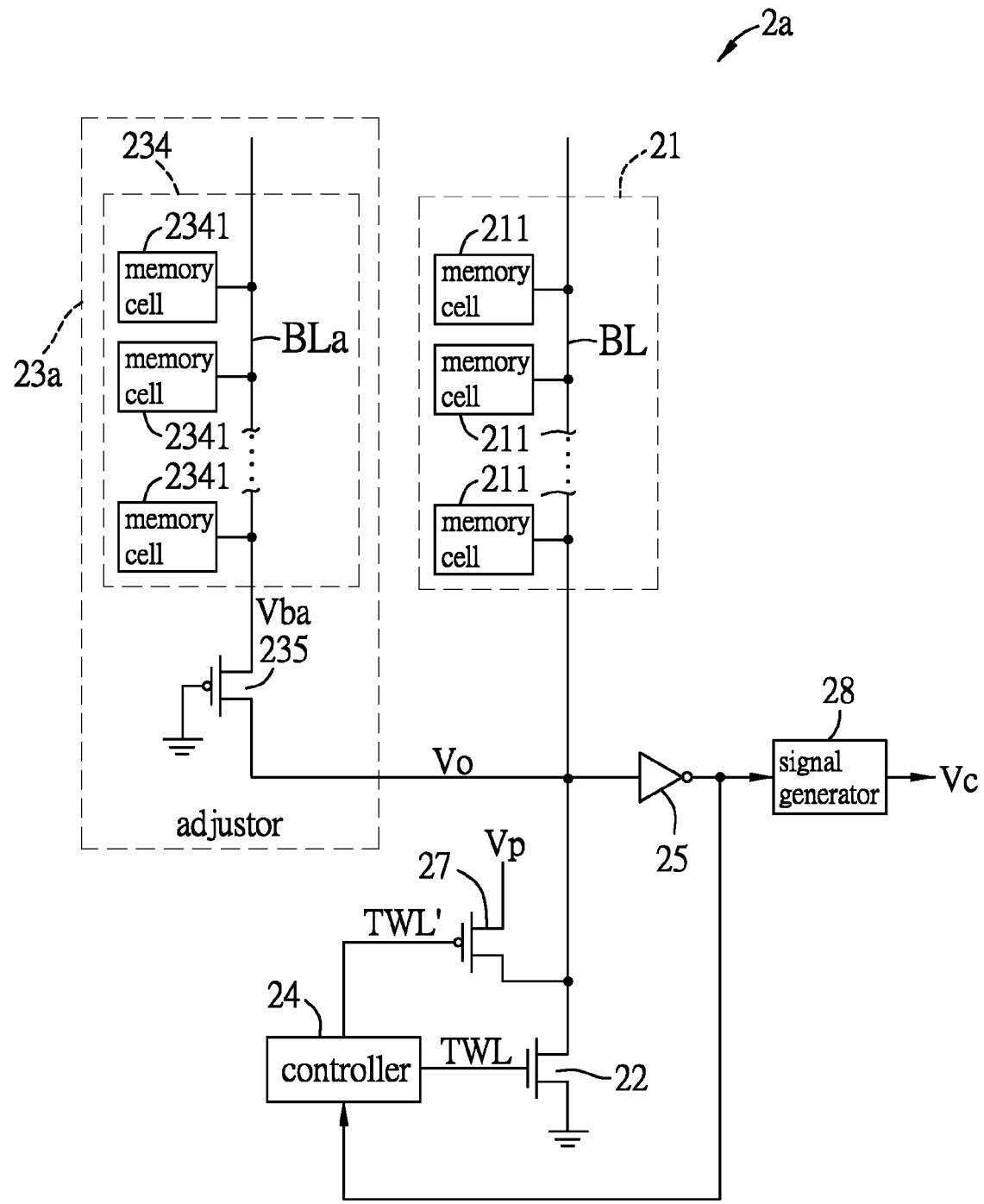
FIG. 6 is a circuit block diagram illustrating a second embodiment of the control device according to the disclosure.

Referring to FIG. 6, a second embodiment of the control device (2a) according to the disclosure is a modification of the first embodiment, and differs from the first embodiment in that the first terminal of the transistor 22 is coupled to a common node of the bit line (BL) and the adjustor (23a), and also in the configuration of the adjustor (23a).

In the second embodiment, the adjustor (23a) includes a dummy memory cell group 234 and a transistor 235. The dummy memory cell group 234 includes a plurality of memory cells 2341, and a bit line (BLa) that is coupled to the memory cells 2341. Each memory cell 2341 is, for example, a 6T SRAM cell. The transistor 235 (e.g., a pMOSFET) is coupled between the bit line (BLa) and the first terminal of the transistor 22, has a control terminal that is grounded, and provides a resistance between the bit line (BLa) and the first terminal of the transistor 22. When the control signals (TWL, TWL') are both at the logic low level, the adjustor (23a) draws charges from the first terminal of the transistor 22, and a voltage (Vba) at the bit line (BLa) increases gradually and is lower than the pre-charge voltage (Vp). When the control signals (TWL, TWL') are both at the logic high level, the adjustor (23a) provides charges to the first terminal of the transistor 22, and the voltage (Vba) decreases gradually.

Referring to FIGS. 5 and 6, the switching threshold of the inverter 25 in the circumstance where the fabrication process varies to the NSPF corner is higher than that in the circumstance where the fabrication process varies to the NSPS corner. In addition, the resistance provided by the transistor 235 in the circumstance where the fabrication process varies to the NSPF corner is less than that in the circumstance where the fabrication process varies to the NSPS corner, and as a result, in the circumstance where the fabrication process varies to the NSPF corner, a current flowing through the transistor 235 from the second terminal thereof to the first terminal thereof during the time interval (where the control signals (TWL, TWL') are both at the logic low level) is greater, an amount of energy stored in the dummy memory cell group 234 at the time point (t0) is greater, and the decrease of the voltage (Vo) during the another time interval (where the control signals (TWL, TWL') are both at the logic high level) is slower, as respectively compared to those in the circumstance where the fabrication process varies to the NSPS corner. Therefore, the control device (2a) of this embodiment can be designed such that, regardless of the variation of the fabrication process to the NSPS corner or the NSPF corner, the sense enable signal (Vc) switches to the logic high level at the same time point (t2). As a result, the operation speed of the semiconductor memory device 3 (see FIG. 4) can be relatively high, and the sense amplifier circuit 31 (see FIG. 4) can correctly sense the difference (V11) at the time point (t2) in both the circumstances where the fabrication process varies respectively to the NSPS corner and the NSPF corner.

Figure 7:
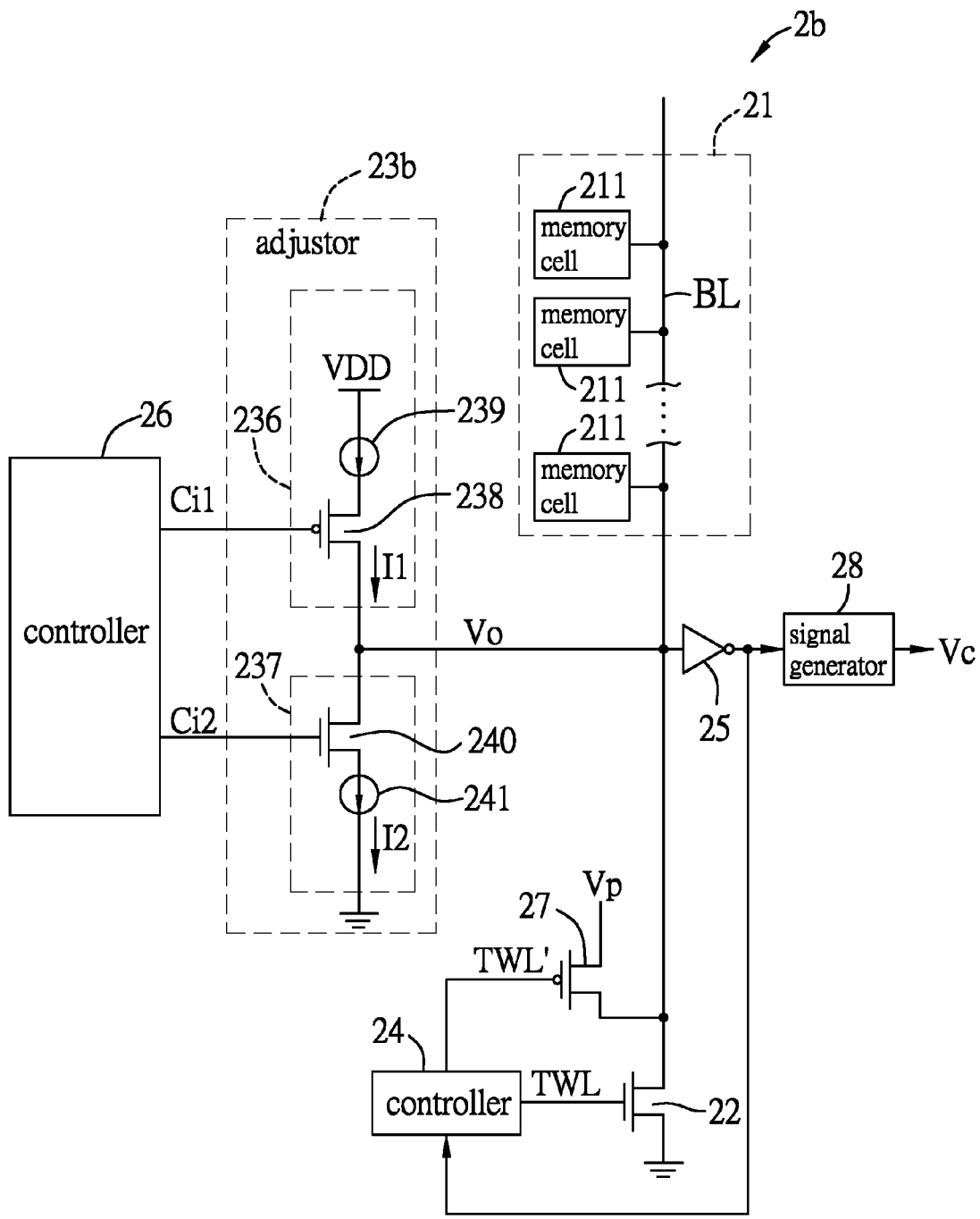
FIG. 7 is a circuit block diagram illustrating a third embodiment of the control device according to the disclosure.

Referring to FIG. 7, a third embodiment of the control device (2b) according to the disclosure is a modification of the second embodiment, and differs from the second embodiment in the configuration of the adjustor (23b), in the timing of the control signals (TWL, TWL'), and in that the control device (2b) further includes a controller 26.

In the third embodiment, the adjustor (23b) includes a charger 236 and a discharger 237. The charger 236 is coupled to the first terminal of the transistor 22, and receives a control signal (Ci1). Based on the control signal (Ci1), the charger 236 is operable to provide a charging current (I1) (i.e., providing charges) to the first terminal of the transistor 22. The discharger 237 is coupled to the first terminal of the transistor 22, and receives a control signal (Ci2). Based on the control signal (Ci2), the discharger 237 is operable to draw a discharging current (I2) (i.e., drawing charges) from the first terminal of the transistor 22.

In this embodiment, the charger 236 includes a switch 238 and a charging current source 239. The switch 238 (e.g., a pMOSFET) has a first terminal, a second terminal that is coupled to the first terminal of the transistor 22, and a control terminal that receives the control signal (Ci1). The charging current source 239 is coupled to the first terminal of the switch 238, and provides the charging current (I1) that flows through the switch 238 from the first terminal thereof to the second terminal thereof when the switch 238 conducts. The discharger 237 includes a switch 240 and a discharging current source 241. The switch 240 (e.g., an nMOSFET) has a first terminal that is coupled to the first terminal of the transistor 22, a second terminal, and a control terminal that receives the control signal (Ci2). The discharging current source 241 is coupled to the second terminal of the switch 240, and provides the discharging current (I2) that flows through the switch 240 from the first terminal thereof to the second terminal thereof when the switch 240 conducts.

The controller 26 is coupled to the control terminals of the switches 238, 240, and generates the control signals (Ci1, Ci2) for respectively controlling the switches 238, 240. Each control signal (Ci1, Ci2) is switchable between the logic high level and the logic low level.

Figure 8:
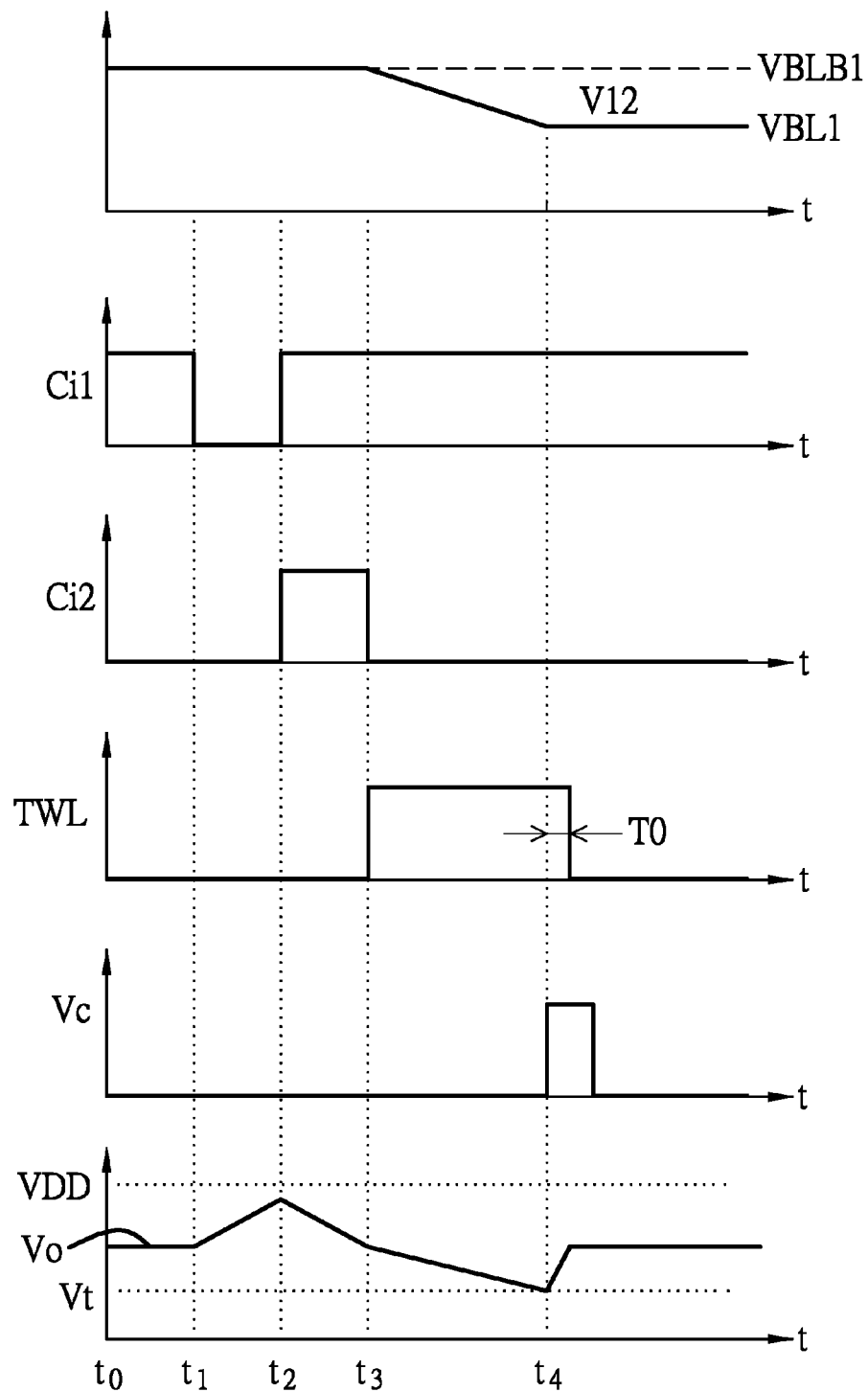
FIG. 8 is a timing diagram illustrating operation of the third embodiment and the semiconductor memory device.

FIG. 8 depicts the voltages (VBL1, VBLB1), the control signals (Ci1, Ci2, TWL), the sense enable signal (Vc) and the voltage (Vo). For simplifying the description of the operations of the control device (2b) of this embodiment and the semiconductor memory device 3 (see FIG. 4) below, it is assumed that the switching of the control signal (TWL) to the logic low level and the switching of the control signal (TWL') to the logic high level are substantially concurrent with the switching of the sense start signal to the logic high level (i.e., the time interval (T0) and the time interval between the switching of the sense start signal to the logic high level and the switching of the control signal (TWL') to the logic high level are very short, and can be neglected).

Referring to FIGS. 7 and 8, when the memory cell array 32 (see FIG. 4) is not read, the control signals (TWL, TWL', Ci1, Ci2) are generated in such a way that: (a) during a first time interval from a time point (to) to a time point ($t_1$), the control signals (TWL, TWL', Ci2) are at the logic low level, and the control signal (Ci1) is at the logic high level, and as a result, the transistor 27 conducts, the transistor 22 and the switches 238, 240 do not conduct, and the voltage (Vo) equals the pre-charge voltage (Vp); (b) during a second time interval which is from the time point ($t_1$) to a time point ($t_2$) and which has a constant duration despite any fabrication variations, the control signals (TWL, Ci1, Ci2) are at the logic low level, and the control signal (TWL') is at the logic high level, and as a result, the switch 238 conducts, the transistors 22, 27 and the switch 240 do not conduct, and the voltage (Vo) increases gradually; and (c) during a third time interval which is from the time point ($t_2$) to a time point ($t_3$) and which has a constant duration despite any fabrication variations, the control signal (TWL) is at the logic low level, and the control signals (TWL', Ci1, Ci2) are at the logic high level, and as a result, the switch 240 conducts, the transistors 22, 27 and the switch 238 do not conduct, and the voltage (Vo) decreases gradually.

When the memory cell array 32 (see FIG. 4) is read, the control signals (TWL, TWL', Ci1, Ci2) are generated in such a way that: (a) starting from the time point ($t_3$), the control signal (Ci2) is at the logic low level, and the control signals (TWL, TWL', Ci1) are at the logic high level, and as a result, the transistor 22 conducts, the transistor 27 and the switches 238, 240 do not conduct, and the voltage (Vo) decreases gradually and reaches the switching threshold (Vt) of the inverter 25 at a time point ($t_4$); and (b) starting from the time point ($t_4$), the control signals (TWL, TWL', Ci2) are at the logic low level, and the control signal (Ci1) is at the logic high level, and as a result, the transistor 27 conducts, the transistor 22 and the switches 238, 240 do not conduct, and the voltage (Vo) increases gradually to the pre-charge voltage (Vp).

The switching threshold (Vt) of the inverter 25 in the circumstance where the fabrication process varies to the NSPF corner is higher than that in the circumstance where the fabrication process varies to the NSPS corner. In addition, the control device (2b) of this embodiment can be designed such that the charging current (I1) substantially equals the discharging current (I2) in the circumstance where the fabrication process varies to the NSPS corner, and is greater than the discharging current (I2) in the circumstance where the fabrication process varies to the NSPF corner, and as a result, in the circumstance where the fabrication process varies to the NSPF corner, the amount of the energy stored in the dummy memory cell group 21 at the time point ($t_3$) is greater, and the decrease of the voltage (Vo) during a fourth time interval from the time point ($t_3$) to the time point ($t_4$) is slower, as respectively compared to those in the circumstance where the fabrication process varies to the NSPS corner. Therefore, the control device (2b) of this embodiment can be designed such that, regardless of the variation of the fabrication process to the NSPS corner or the NSPF corner, the sense enable signal (Vc) switches to the active state at the same time point ($t_4$), at which a difference (V12) between the voltages (VBL1, VBLB1) equals the minimum voltage difference that the sense amplifier circuit 31 (see FIG. 4) can sense correctly. As a result, the operation speed of the semiconductor memory device 3 (see FIG. 4) can be relatively high, and the sense amplifier circuit 31 (see FIG. 4) can correctly sense the difference (V12) at the time point ($t_4$) in both the circumstances where the fabrication process varies respectively to the NSPS corner and the NSPF corner.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what are considered the exemplary embodiments, it is understood that the disclosure is not limited to the disclosed embodiments but is intended to cover various arrangements included within the spirit and scope of the broadest interpretation so as to encompass all such modifications and equivalent arrangements.

What is claimed is:

1. A control device used with a semiconductor memory device that includes a plurality of memory cell groups and a sense amplifier circuit, the sense amplifier circuit being coupled to the memory cell groups, and being operable between an enabled state and a disabled state, the sense amplifier circuit sensing data respectively outputted by the memory cell groups when operating in the enabled state, said control device comprising:
a dummy memory cell group;
a first transistor having a first terminal, a second terminal that is grounded, and a control terminal;
an adjustor including a plurality of transistors, the adjustor being coupled to said dummy memory cell group and said first terminal of said first transistor, and providing a resistance between said dummy memory cell group and said first terminal of said first transistor;
an inverter coupled to said first terminal of said first transistor, and generating, based on a voltage at said first terminal of said first transistor, a sense start signal that is associated with switching of the sense amplifier circuit from the disabled state to the enabled state; and
a controller coupled to said inverter for receiving the sense start signal therefrom, coupled further to said control terminal of said first transistor, and generating, based on the sense start signal, a first control signal for controlling said first transistor such that switching of said first transistor from conduction into non-conduction is associated with the sense start signal.

2. The control device of claim 1, wherein the plurality of transistors of said adjustor includes:
a second transistor coupled between said dummy memory cell group and said first terminal of said first transistor, and having a control terminal;
a third transistor having a first terminal that is used to receive a supply voltage, a second terminal that is coupled to said control terminal of said second transistor, and a control terminal that is coupled to said first terminal thereof; and
a fourth transistor having a first terminal that is coupled to said control terminal of said second transistor, a second terminal that is grounded, and a control terminal that is coupled to said second terminal thereof.

3. The control device of claim 2, wherein each of said first and third transistors is an N-type metal oxide semiconductor field effect transistor, and each of said second and fourth transistors is a P-type metal oxide semiconductor field effect transistor.

4. The control device of claim 1, further comprising: a signal generator coupled to said inverter for receiving the sense start signal therefrom, used to be coupled further to the sense amplifier circuit, and generating, based on the sense start signal and a predetermined time interval, a sense enable signal for controlling operation of the sense amplifier circuit between the enabled state and the disabled state.

5. The control device of claim 4, wherein:
the sense start signal is switchable between a logic high level and a logic low level;
the sense enable signal is switchable between an active state that corresponds to the enabled state of the sense amplifier circuit, and an inactive state that corresponds to the disabled state of the sense amplifier circuit; and
the sense enable signal switches to the active state upon switching of the sense start signal to the logic high level, and remains in the active state for the predetermined time interval before switching to the inactive state.

6. The control device of claim 1, further comprising:
a second transistor having a first terminal that is used to receive a pre-charge voltage, a second terminal that is coupled to said first terminal of said first transistor, and a control terminal;
wherein said controller is coupled further to said control terminal of said second transistor, and further generating, based on the sense start signal, a second control signal for controlling said second transistor such that switching of said second transistor from non-conduction into conduction is associated with the sense start signal.

7. The control device of claim 6, wherein:
the sense start signal is switchable between a logic high level and a logic low level; and
said first transistor switches into non-conduction and said second transistor switches into conduction upon switching of the sense start signal to the logic high level.

8. The control device of claim 1, wherein said dummy memory cell group includes a plurality of memory cells, and a bit line that is coupled to said memory cells and said adjustor.

9. A control device used with a semiconductor memory device that includes a plurality of memory cell groups and a sense amplifier circuit, the sense amplifier circuit being coupled to the memory cell groups, and being operable between an enabled state and a disabled state, the sense amplifier circuit sensing data respectively outputted by the memory cell groups when operating in the enabled state, said control device comprising:
a first dummy memory cell group;
a first transistor having a first terminal that is coupled to said first dummy memory cell group, a second terminal that is grounded, and a control terminal;
an adjustor coupled to said first terminal of said first transistor, and operable to provide charges to or draw charges from said first terminal of said first transistor;
an inverter coupled to said first terminal of said first transistor a second transistor having a first terminal that is used to receive a pre-charge, and generating, based on a voltage at said first terminal of said first transistor, a sense start signal that is associated with switching of the sense amplifier circuit from the disabled state to the enabled state; and
a first controller coupled to said inverter for receiving the sense start signal therefrom, coupled further to said control terminal of said first transistor, and generating, based on the sense start signal, a first control signal for controlling said first transistor such that switching of said first transistor from conduction into non-conduction is associated with the sense start signal.

10. The control device of claim 9, wherein said adjustor includes:
a second dummy memory cell group; and
a second transistor coupled between said second dummy memory cell group and said first terminal of said first transistor, and having a control terminal that is grounded.

11. The control device of claim 10, wherein said first transistor is an N-type metal oxide semiconductor field effect transistor (nMOSFET), and said second transistor is a P-type metal oxide semiconductor field effect transistor (pMOSFET).

12. The control device of claim 9, wherein said adjustor includes:
a charger coupled to said first terminal of said first transistor, and receiving a second control signal;
based on the second control signal, said charger being operable to provide a charging current to said first terminal of said first transistor; and
a discharger coupled to said first terminal of said first transistor, and receiving a third control signal;
based on the third control signal, said discharger being operable to draw a discharging current from said first terminal of said first transistor.

13. The control device of claim 12, wherein:
said charger includes
a first switch having a first terminal, a second terminal that is coupled to said first terminal of said first transistor, and a control terminal that receives the second control signal, and
a charging current source coupled to said first terminal of said first switch, and providing the charging current that flows through said first switch from said first terminal thereof to said second terminal thereof when said first switch conducts; and
said discharger includes
a second switch having a first terminal that is coupled to said first terminal of said first transistor, a second terminal, and a control terminal that receives the third control signal, and
a discharging current source coupled to said second terminal of said second switch, and providing the discharging current that flows through said second switch from said first terminal thereof to said second terminal thereof when said second switch conducts.

14. The control device of claim 13, wherein each of said first transistor and said second switch is an nMOSFET, and said first switch is a pMOSFET.

15. The control device of claim 12, further comprising a second controller that is coupled to said charger and said discharger, and that generates the second and third control signals respectively for said charger and said discharger.

16. The control device of claim 9, further comprising:
a signal generator coupled to said inverter for receiving the sense start signal therefrom, used to be coupled further to the sense amplifier circuit, and generating, based on the sense start signal and a predetermined time interval, a sense enable signal for controlling operation of the sense amplifier circuit between the enabled state and the disabled state.

17. The control device of claim 16, wherein:
the sense start signal is switchable between a logic high level and a logic low level;
the sense enable signal is switchable between an active state that corresponds to the enabled state of the sense amplifier circuit, and an inactive state that corresponds to the disabled state of the sense amplifier circuit; and
the sense enable signal switches to the active state upon switching of the sense start signal to the logic high level, and remains in the active state for the predetermined time interval before switching to the inactive state.

18. The control device of claim 9, further comprising:
wherein said first controller is coupled further to said control terminal of said second transistor, and further generating, based on the sense start signal, a second control signal for controlling said second transistor such that switching of said second transistor from non-conduction into conduction is associated with the sense start signal.

19. The control device of claim 18, wherein:
the sense start signal is switchable between a logic high level and a logic low level; and
said first transistor switches into non-conduction and said second transistor switches into conduction upon switching of the sense start signal to the logic high level.

20. The control device of claim 9, wherein said first dummy memory cell group includes a plurality of memory cells, and a bit line that is coupled to said memory cells and said first terminal of said first transistor.

* * * * *